United States Patent
Nichols et al.

(10) Patent No.: US 7,842,972 B2
(45) Date of Patent: Nov. 30, 2010

(54) LOW-TEMPERATURE-GROWN (LTG) INSULATED-GATE PHEMT DEVICE AND METHOD

(75) Inventors: Kirby B. Nichols, Chelmsford, MA (US); Robert Actis, Burlington, MA (US); Dong Xu, Nashua, NH (US); Wendell M. T. Kong, Hollis, NH (US)

(73) Assignee: Retro Reflective Optics, LLC, Portsmouth, NH (US)

( * ) Notice: Subject to any disclaimer, the term of this patent is extended or adjusted under 35 U.S.C. 154(b) by 0 days.

(21) Appl. No.: 11/632,670

(22) PCT Filed: Dec. 1, 2005

(86) PCT No.: PCT/US2005/043357
§ 371 (c)(1),
(2), (4) Date: Jan. 17, 2007

(87) PCT Pub. No.: WO2006/083383
PCT Pub. Date: Aug. 10, 2006

(65) Prior Publication Data
US 2008/0017844 A1      Jan. 24, 2008

Related U.S. Application Data

(60) Provisional application No. 60/632,710, filed on Dec. 1, 2004.

(51) Int. Cl.
*H01L 29/24* (2006.01)

(52) U.S. Cl. .............. 257/192; 257/194; 257/E29.246; 257/E21.403; 257/E21.407

(58) Field of Classification Search .................. 257/192, 257/194, E21.403, E21.407, E29.246–E29.248, 257/E29.252; 438/167, 172
See application file for complete search history.

(56) References Cited

U.S. PATENT DOCUMENTS

| | | | |
|---|---|---|---|
| 5,038,187 A * | 8/1991 | Zhou ......................... 257/194 |
| 5,140,386 A | 8/1992 | Huang et al. |
| 5,180,681 A * | 1/1993 | Mishra et al. ............... 438/167 |
| 6,100,542 A * | 8/2000 | Kohara et al. ................. 257/20 |
| 6,316,820 B1 | 11/2001 | Schmitz et al. |
| 6,593,603 B1 | 7/2003 | Kim et al. |
| 6,656,802 B2 | 12/2003 | Oszustowicz |
| 6,995,407 B2 * | 2/2006 | Taylor et al. ................ 257/113 |
| 2004/0082158 A1 | 4/2004 | Whelan et al. |
| 2006/0113563 A1* | 6/2006 | Osada et al. ................ 257/192 |

FOREIGN PATENT DOCUMENTS

WO    WO 2004059744 A1 *   7/2004

OTHER PUBLICATIONS

Actis, R., et al., "Insulated-gate PHEMT Awitching Devices Fabricated With A Low-Temperature-Grown (LTG) GaAs Gate Insulator," GOMACTech-05, pp. 403-406, Apr. 2005 (4 pages).

* cited by examiner

*Primary Examiner*—David Vu
*Assistant Examiner*—Suberr Chi (57) ABSTRACT

A pseudomorphic-high-electron-mobility-transistor (PHEMT) includes a substrate, a low-temperature-grown (LTG) GaAs gate-insulator layer disposed on the substrate, and a gate electrode disposed on the gate-insulator layer.

3 Claims, 8 Drawing Sheets

LOW-TEMPERATURE-GROWN (LTG) INSULATED-GATE PHEMT DEVICE AND METHOD

CROSS-REFERENCE TO RELATED APPLICATION

This application claims priority benefits under 35 USC §119(e) to Provisional Patent Application No. 60/632,710, filed 1 Dec. 2004, which application is incorporated herein by reference.

STATEMENT OF GOVERNMENT INTEREST

The invention was made with United States Government support under Contract (Grant) No. DAAD19-01-2-0008 awarded by the Army. The United States Government has certain rights in this invention.

RELATED PUBLICATION

"Insulated-gate PHEMT Switching Devices Fabricated with a Low-Temperature-Grown (LTG) GaAs Gate Insulator," R. Actis, K. Nichols, D. Xu, X. Yang, M. Pizzella, W. Kong, GOMACTech-05, pp. 403-406, April 2005, which is incorporated herein by reference.

BACKGROUND

Several types of field-effect-transistors (FETs) are available for use at microwave/millimeter-wave frequencies. These high-frequency FETs include metal-semiconductor-field-effect-transistors (MESFETs) and high-electron-mobility-transistors (HEMTs). A HEMT is distinguished from a MESFET in that in a HEMT, charge is transferred from a charge donor layer to an undoped channel layer.

There are generally two types of HEMTs. One type is referred to simply as a HEMT, whereas the other type is referred to as a pseudomorphic-HEMT or PHEMT. The difference between a HEMT and a PHEMT is that in the PHEMT, one or more layers of the PHEMT have a lattice constant that differs significantly from the lattice constant of other materials that compose the device. As a result of this lattice mismatch, the crystal structure of the material forming the PHEMT channel layer is strained. Although this lattice mismatch (and the corresponding strain) makes growth of PHEMTs more difficult than the growth of HEMTs, several performance advantages are obtained. For example, the charge density transferred into the PHEMT channel layer is increased, often resulting in high electron mobility and high electron saturated velocity. As a result, a PHEMT can develop higher power levels and can operate at higher frequencies with improved noise properties as compared to a HEMT.

In particular, the gallium arsenide (GaAs) PHEMT has played a major role in microwave/millimeter-wave amplification and control applications. However, to enable still more capable systems, there continues to be significant efforts aimed at improving the breakdown voltage and the power-handling performance of a GaAs PHEMT. An improvement to the PHEMT structure can be achieved for power and switch devices by emulating the metal-oxide-semiconductor (MOS) device structures commonly found in Silicon-based FET technology. The primary limitation why such a similar device has not found its way into GaAs technology is the notable absence of a viable gate-insulator material.

Previous attempts for such a gate-insulator layer include the use of oxides, sapphire materials, and aluminum oxides. However, these attempts have typically been unsuccessful because once a GaAs wafer is removed from a processing chamber (typically a molecular-beam-epitaxy chamber), the surface of the wafer often forms holes, i.e., "pins", such that it is difficult to impossible to form an oxide or other type of insulator on the wafer surface in a chemical-vapor-deposition (CVD) chamber.

SUMMARY

An embodiment of a pseudomorphic-high-electron-mobility-transistor (PHEMT) includes a substrate, a low-temperature-grown (LTG) GaAs gate-insulator layer disposed on the substrate, and a gate electrode disposed on the gate-insulator layer.

DETAILED DESCRIPTION

The following discussion of an embodiment of the invention illustrates the use of a highly-insulating crystalline material known as low-temperature-grown (LTG) GaAs as a PHEMT gate insulator. LTG GaAs is lattice-matched to the underlying GaAs and exhibits properties that make it suited for use as a gate insulator in a GaAs PHEMT device. As a material, LTG GaAs is deposited, or grown, by molecular-beam-epitaxy (MBE) at a relatively low substrate temperature (~200° C.) as compared with the deposition temperature of conventional conducting GaAs (~600° C.). The low growth temperature results in a material exhibiting a combination of high breakdown field, high resistivity, and short photoexcited-carrier lifetime. Table I is a comparison of features of LTG GaAs with features of conventional GaAs grown by MBE.

TABLE I

| | Conventional GaAs (MBE) | LTG GaAs (MBE) |
|---|---|---|
| Growth Temperature | ~600° C. | ~200° C. |
| Trap Density | <$10^{15}/cm^3$ | ~$10^{19}/cm^3$ |
| Breakdown Field | ~$3 \times 10^4$ V/cm | ~$5 \times 10^5$ V/cm |
| Resistivity | 0.3-20 Ω-cm | ~$10^6$ Ω-cm |
| Carrier Lifetime | ~1 nano second | ~150 fempto seconds |

Figure 1:
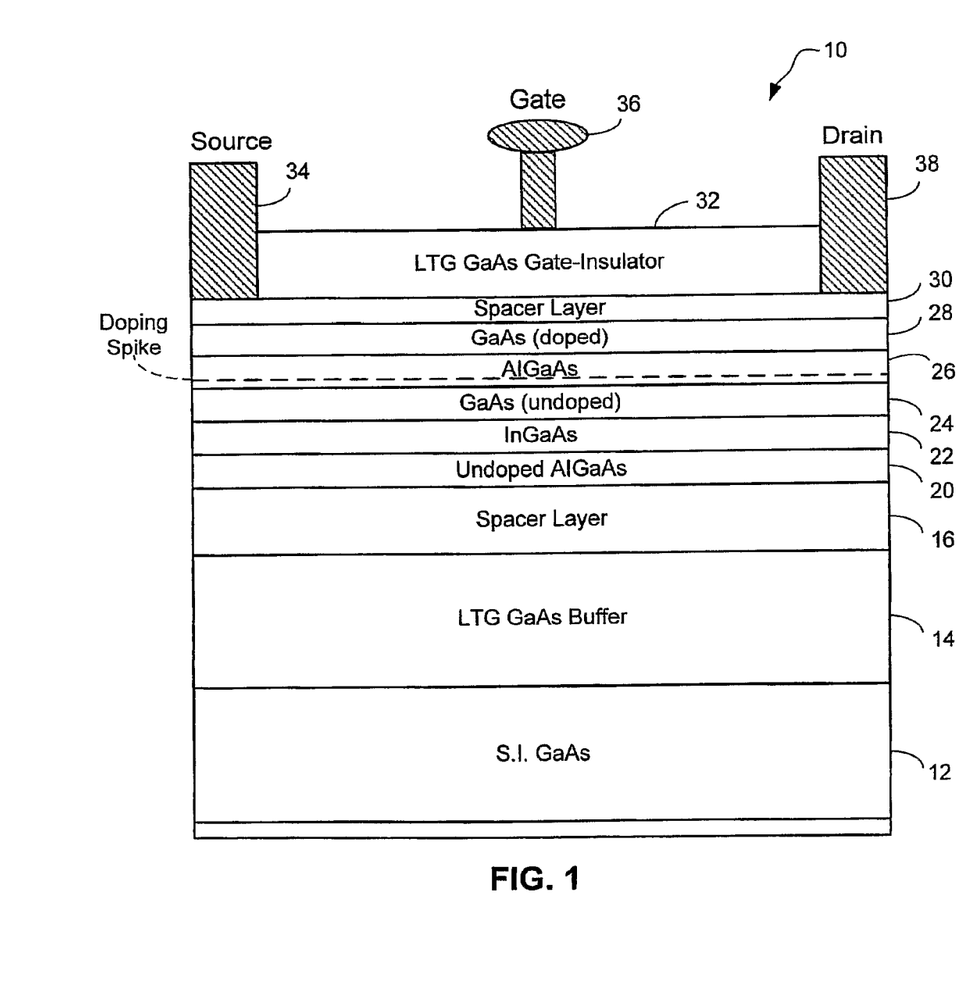
FIG. 1 is a cross-sectional diagram of a PHEMT according to an embodiment of the invention.

LTG GaAs is often suited for microwave applications because of its outstanding insulating properties and its natural lattice match to conventional conducting GaAs. An example PHEMT device utilizing a LTG GaAs gate-insulator layer and a LTG GaAs buffer layer is shown in FIG. 1. In this example, LTG GaAs is used both as the buffer layer and as the gate-insulator layer to provide improved channel-current confinement in the device.

FIG. 1 is a cross-sectional diagram of a PHEMT 10 that is structured and formed according to an embodiment of the invention. The PHEMT 10 includes a substrate 12, a LTG GaAs buffer layer 14, a first spacer layer 16, a first undoped AlGaAs layer 20, an InGaAs channel layer 22, a second undoped AlGaAs layer 24, a doped AlGaAs layer 26, a doped GaAs layer 28, a second spacer layer 30, a LTG GaAs gate-insulator layer 32, a source electrode 34, a gate electrode 36, and a drain electrode 38. All of the layers of the PHEMT 10 are deposited/grown by molecular beam epitaxy (MBE) in an MBE chamber, although other deposition/growth techniques are contemplated.

The substrate 12 is a substrate-on-insulator GaAs layer.

The buffer layer 14 and the first spacer layer 16 are disposed on the substrate 12 to prevent carriers from leaking into the substrate.

The LTG GaAs buffer layer 14 is disposed on the substrate 12, and allows the PHEMT 10 to have a good drain-source current pinch-off. The LTG GaAs buffer layer 14 is grown at approximately 200° C. within a tolerance of approximately ±10° C. This causes the carriers within the buffer layer 14 to have a low mobility and thus causes the buffer layer to have a high resistance. The buffer layer 14 is also undoped, and has a thickness in the range of approximately 0.5 microns (µm) to approximately 1.0 µm.

The first spacer layer 16 is disposed on the LTG GaAs buffer layer 14, and improves the mobility of charge within the first undoped AlGaAs layer 20.

In one embodiment, the first spacer layer 16 is a combination of multiple layers as discussed below in conjunction with FIG. 2.

Figure 2:
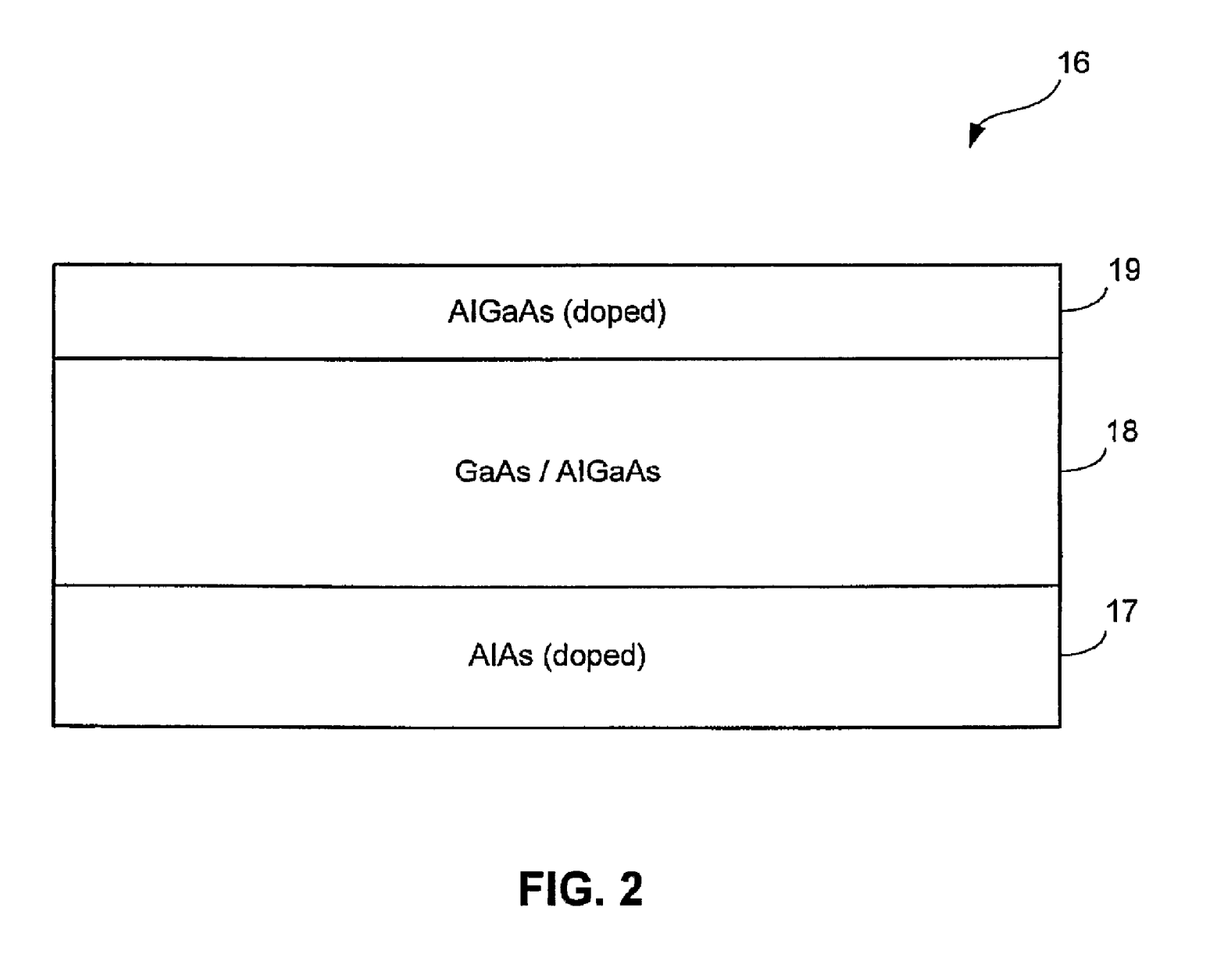
FIG. 2 is a cross-sectional diagram of a first spacer layer of the PHEMT in FIG. 1.

Referring to FIG. 2, the first spacer layer 16 includes a first doped layer 17, a super-lattice layer 18, and a second doped layer 19.

The first doped layer 17 is disposed on the LTG GaAs buffer layer 14, and has a thickness of approximately 100 Å. In one embodiment, the first doped layer 17 is an AlAs layer doped with silicon. But the layer 17 may also be an AlGaAs layer having approximately 50% or more aluminum.

The super-lattice layer 18 is disposed on the first doped layer 17, is a super-lattice GaAs/AlGaAs layer, and has a thickness in the range of approximately 200 Å to approximately 800 Å.

The second doped layer 19 acts as a carrier barrier layer, is disposed on the super-lattice layer 18, is a doped AlGaAs layer, and has a thickness of approximately 50 Å.

Referring again to FIG. 1, the first undoped AlGaAs layer 20 is disposed on the first spacer layer 16, and has a thickness of approximately 50 Å.

The InGaAs channel layer 22 is disposed on the first undoped AlGaAs layer 20, is where the channel between the drain and source electrodes 34 and 38 is formed, and has a thickness in the range of approximately 90 Å to approximately 120 Å. The channel layer 22 may be doped so as to be conducting P- or N-type material.

The second undoped AlGaAs layer 24 is disposed on the InGaAs channel layer 22, and has a thickness of approximately 45 Å.

The doped AlGaAs layer 26 is disposed on the second undoped AlGaAs layer 24, and has a thickness of approximately 200 Å. During the formation of the doped AlGaAs layer 26, a silicon doping spike 27 is formed as indicated by the dashed line, where the concentration of the doping spike 27 is approximately $4 \times 10^{12}$ atoms/cm$^3$. For example, the deposition of AlGaAs layer 26 is temporarily halted, and a layer of Si having a concentration of approximately $4 \times 10^{12}$ Si atoms is formed. Then, the remaining portion of the AlGaAs layer 26 is formed over the Si layer. Furthermore, it is contemplated that Si atoms from the spike layer 27 may diffuse into the upper and lower portions of the AlGaAs layer 26 or into other layers. The doping spike 27 effectively separates the positive dopant charges from the negative dopant charges in the InGaAs channel layer 22 to reduce or eliminate charge scattering.

The doped GaAs layer 28 is disposed on the doped AlGaAs layer 26, and has a thickness in the range of approximately 100 Å to approximately 500 Å, such as a thickness of approximately 300 Å in one embodiment. The GaAs layer 28 is doped with Si, and in one embodiment has a Si-doping concentration of approximately $2 \times 10^{17}$ atoms/cm$^3$.

The second spacer layer 30 is disposed on the doped GaAs layer 28, and has a thickness in the range of approximately 25 Å to approximately 100 Å. In one embodiment, the second spacer layer 30 is an AlAs layer. But the layer 30 may also be an AlGaAs layer having approximately 50% or more aluminum.

The LTG GaAs gate-insulator layer 32 is disposed on the second spacer layer 30, and has a thickness in the range of approximately 200 Å to approximately 1000 Å, such as a thickness of approximately 500 Å. The LTG GaAs gate-insulator layer 32 is grown at approximately 200° C. within a tolerance of approximately ±3° C. Where the insulator layer 32 is thinner than the LTG GaAs buffer layer 14, the tolerance of the growing temperature for the insulator layer 32 may be less than the tolerance for the buffer layer 14. A relatively tight tolerance of the layer 32 growth temperature of about 200° C. causes the insulator layer 32 to have a relatively low carrier lifetime, and thus a relatively high resistivity. The insulator layer 32 is undoped, but doping this and any of the other undoped layers is contemplated.

The gate electrode 36 is disposed on the LTG GaAs insulator layer 32.

The source electrode 34 and the drain electrode 38 each pass through the LTG GaAs insulator layer 32 and contact the second spacer layer 30. Although not shown in FIG. 1, the source 34 and the drain 38 are alloyed down through the layers 30, 28, 26 and 24 until they contact or effectively merge into the channel layer 22 in which is formed a channel between the source 34 and the drain 38.

For switching applications, the LTG GaAs insulated-gate PHEMT 10 may offer several advantages over a conventional PHEMT. First, the LTG GaAs insulator layer 32 may significantly increase the isolation between the gate 36 and the conducting channel. This increased isolation may result in a nearly two-fold increase of the gate-drain breakdown voltage of the PHEMT 10, and may improve the power-handling capability of the device. Second, insofar as conventional PHEMTs are typically limited to a forward gate bias gate-to-source voltage below 0.6V, the insulated-gate PHEMT 10 may be capable of sustaining a forward gate bias of several volts. This relatively large forward bias acts to reduce the channel resistance and associated "on-state" drain-to-source resistance of the PHEMT 10 where the PHEMT behaves like an N-type MOS transistor. Third, the capacitance associated with the LTG GaAs insulator layer 32 may enable the PHEMT 10 to exhibit an overall lower and more constant gate capacitance with a forward bias. These and other characteristics of the LTG GaAs insulated-gate PHEMT 10 are compared with a conventional PHEMT in Table II.

TABLE II

|  | Conventional PHEMT | LTG GaAs Insulated-Gate PHEMT 10 |
|---|---|---|
| On-State Resistance | 1.6-1.8 Ω-mm | 1.0-1.2 Ω-mm |
| Off-State Capacitance | 0.22 pF/mm | 0.44 pF/mm |
| Operating Voltage | −10 to 0.6 V | −16 to 2.5 V |
| Phase-Shifter Loss (Ka-Band) | 1.5 dB/BIT | ~1.4 dB/BIT* |
| Power-Handling Capability | <1 W | ~4 W |
| Channel Resistance | ~1.2 Ω-mm | ~0.4 Ω-mm |
| Contact Resistance | ~0.2 Ω | ~0.3 Ω |
| Figure-of-Merit $R_{on}C_{off}$ | ~0.4 ps | ~0.4 ps |
| Quality Factor $Q_s = 1/(wR_{on}C_{off})|_{10\,GHz}$ | 40 | 40 |

*Non-optimized matching

Another benefit of using the LTG GaAs insulator layer 32 is that it often can be more easily grown on the lower GaAs layers of the PHEMT 10. Because there is a lattice match between the layer 32 and the layer 30 and other underlying layers, the GaAs insulator layer 32 may be grown as a single crystal as opposed to being deposited.

Using LTG GaAs for the gate insulator layer 32 often makes the PHEMT 10 more suitable than conventional PHEMTs for use as a power and switching device for high-speed digital applications. In one embodiment, the PHEMT 10 emulates the metal-oxide-semiconductor (MOS) device structure commonly used in silicon technology. As a result, the LTG GaAs insulated-gate PHEMT 10 provides an improved switching device structure for use at microwave/millimeter-wave frequencies, while often maintaining compatibility with existing GaAs MMIC fabrication lines.

Figure 3:
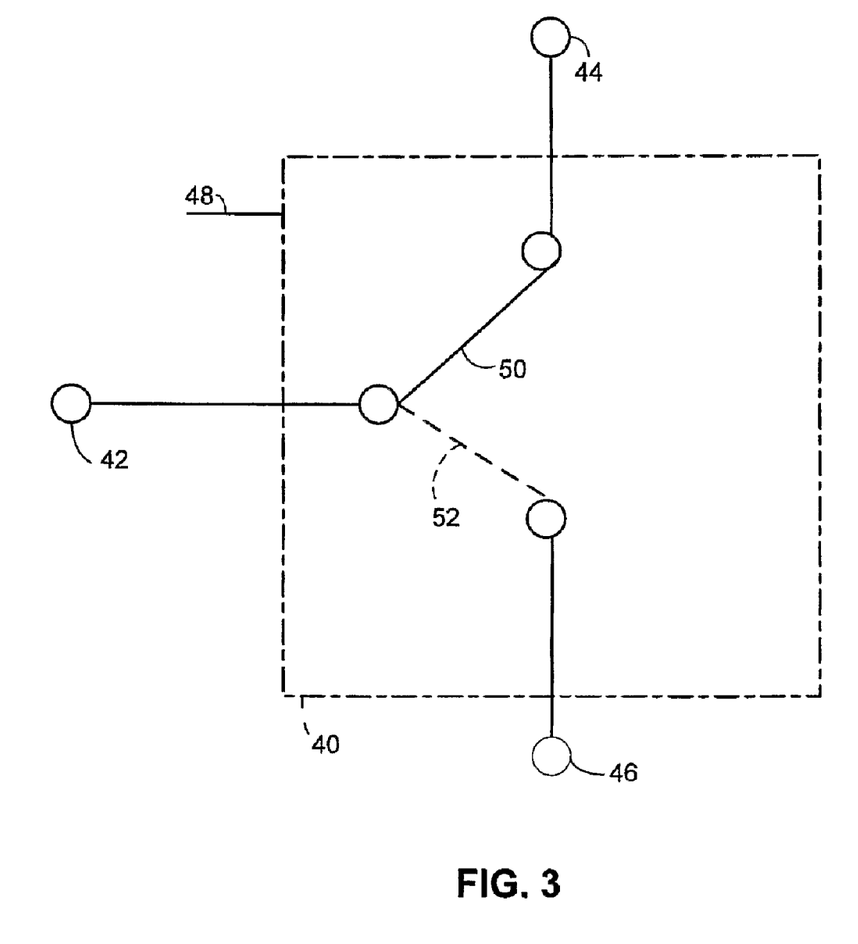
FIG. 3 is a block diagram of a single-pole-double-throw (SPDT) switch that incorporates at least one PHEMT of FIG. 1 according to an embodiment of the invention.

FIG. 3 is a block diagram of a single-pole-double-throw (SPDT) switch 40, which incorporates one or more PHEMT 10 of FIG. 1 according to an embodiment of the invention. The switch 40 includes three signal nodes 42, 44, and 46 and a control node 48. When a signal on the control node 48 has a first level, the switch 40 is in the first throw state in which the node 42 is electrically coupled to the node 44 via a low-resistance path 50 (solid line), and the node 46 is electrically isolated from the nodes 42 and 44. Conversely, when the signal on the control node 48 has a second level, the switch 40 is in the second throw state in which the node 42 is electrically coupled to the node 46 via a low-resistance path 52 (dashed line), and the node 44 is electrically isolated from the nodes 42 and 46.

Figure 4:
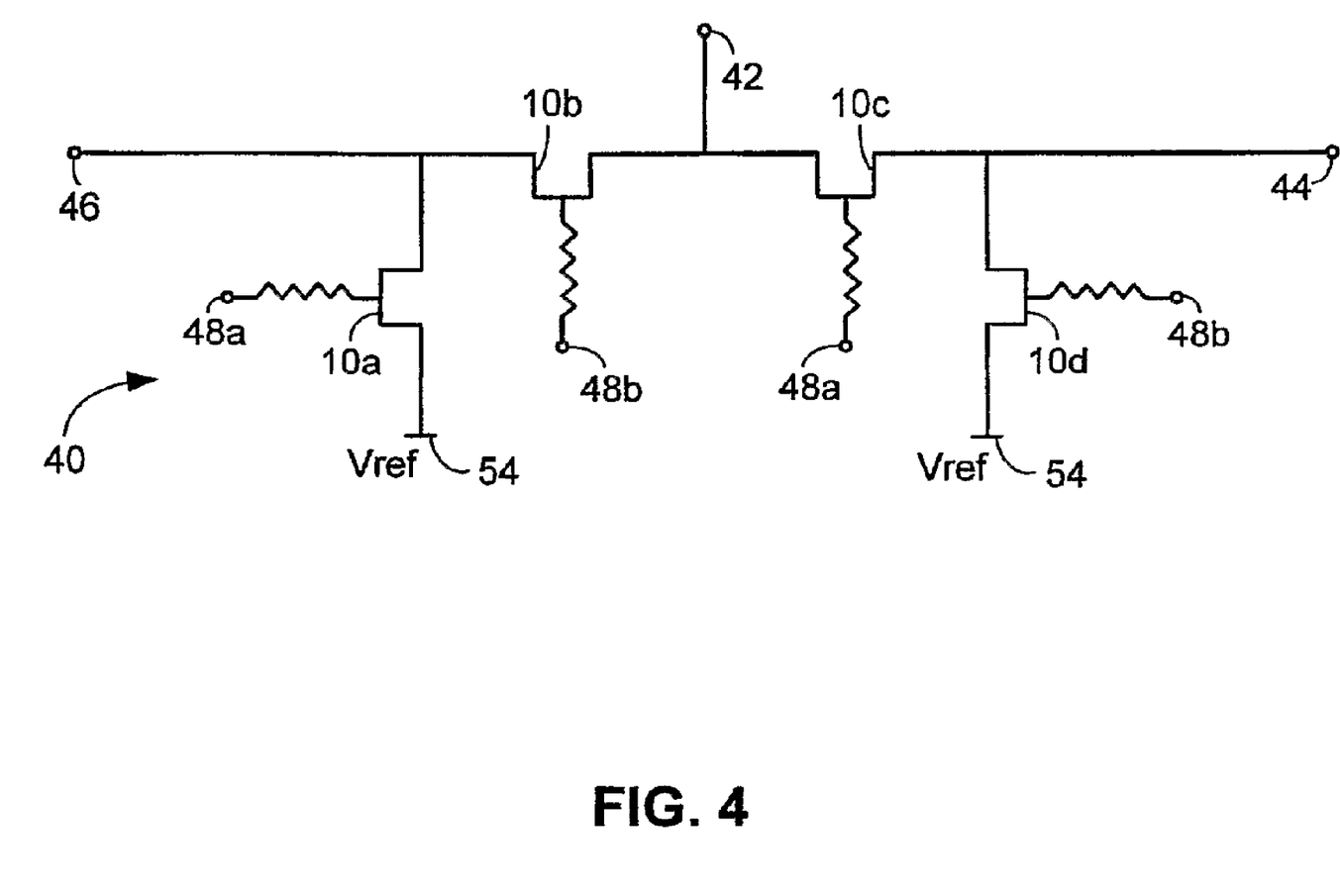
FIG. 4 is a schematic diagram of the switch of FIG. 3 according to an embodiment of the invention.

FIG. 4 is a schematic diagram of the SPDT switch 40 of FIG. 3 according to an embodiment of the invention. The switch 40 includes four PHEMTs 10a-10d, which are similar to the PHEMT 10 of FIG. 1. In addition to the signal nodes 42, 44, and 46, the switch 40 includes two control nodes 48a and 48b, and a reference node 54, which is coupled to a reference voltage Vref such as ground.

When first and second control signals on the control nodes 48a and 48b respectively have logic 1 and logic 0 levels, the switch 40 is in the first throw state in which the node 42 is electrically coupled to the node 44 via a low-resistance path, and the node 46 is electrically isolated from the nodes 42 and 44. More specifically, in response to a logic 1 level (e.g., 1.5 V-5 V) on the node 48a, the PHEMT 10c is "on," and thus provides a low-resistance path between the nodes 42 and 44. Conversely, in response to a logic 0 level (e.g., 0 V) on the node 48b, the PHEMT 10b is "off," and thus electrically isolates the node 46 from the nodes 42 and 44. Furthermore, in response to the logic 1 level on the node 48a, the PHEMT 10a is "on," and thus provides a low-resistance path between the nodes 46 and 54. This low-resistance path pulls the node 46 to Vref, and thus prevents the node 46 from floating electrically. Conversely, in response to the logic 0 level on the node 48b, the PHEMT 10d is "off," and thus electrically isolates the node 44 from the node 54.

Conversely, when the first and second control signals on the control nodes 48a and 48b respectively have logic 0 and logic 1 levels, the switch 40 is in the second throw state in which the node 42 is electrically coupled to the node 46 via a low-resistance path, and the node 44 is electrically isolated from the nodes 42 and 46. More specifically, in response to a logic 1 level on the node 48b, the PHEMT 10b is "on," and thus provides a low-resistance path between the nodes 42 and 46. Conversely, in response to a logic 0 level on the node 48a, the PHEMT 10c is "off," and thus electrically isolates the node 44 from the nodes 42 and 46. Furthermore, in response to the logic 1 level on the node 48b, the PHEMT 10d is "on," and thus provides a low-resistance path between the nodes 44 and 54. This low-resistance path pulls the node 44 to Vref, and thus prevents the node 44 from floating electrically. Conversely, in response to the logic 0 level on the node 48a, the PHEMT 10a is "off," and thus electrically isolates the node 46 from the node 54.

Still referring to FIG. 4, alternate embodiments of the switch 40 are contemplated. For example, the PHEMTs 10a-10d may each operate similarly to a p-channel MOS transistor, and the voltage levels of the control signals and Vref changed as appropriate.

Figure 5:
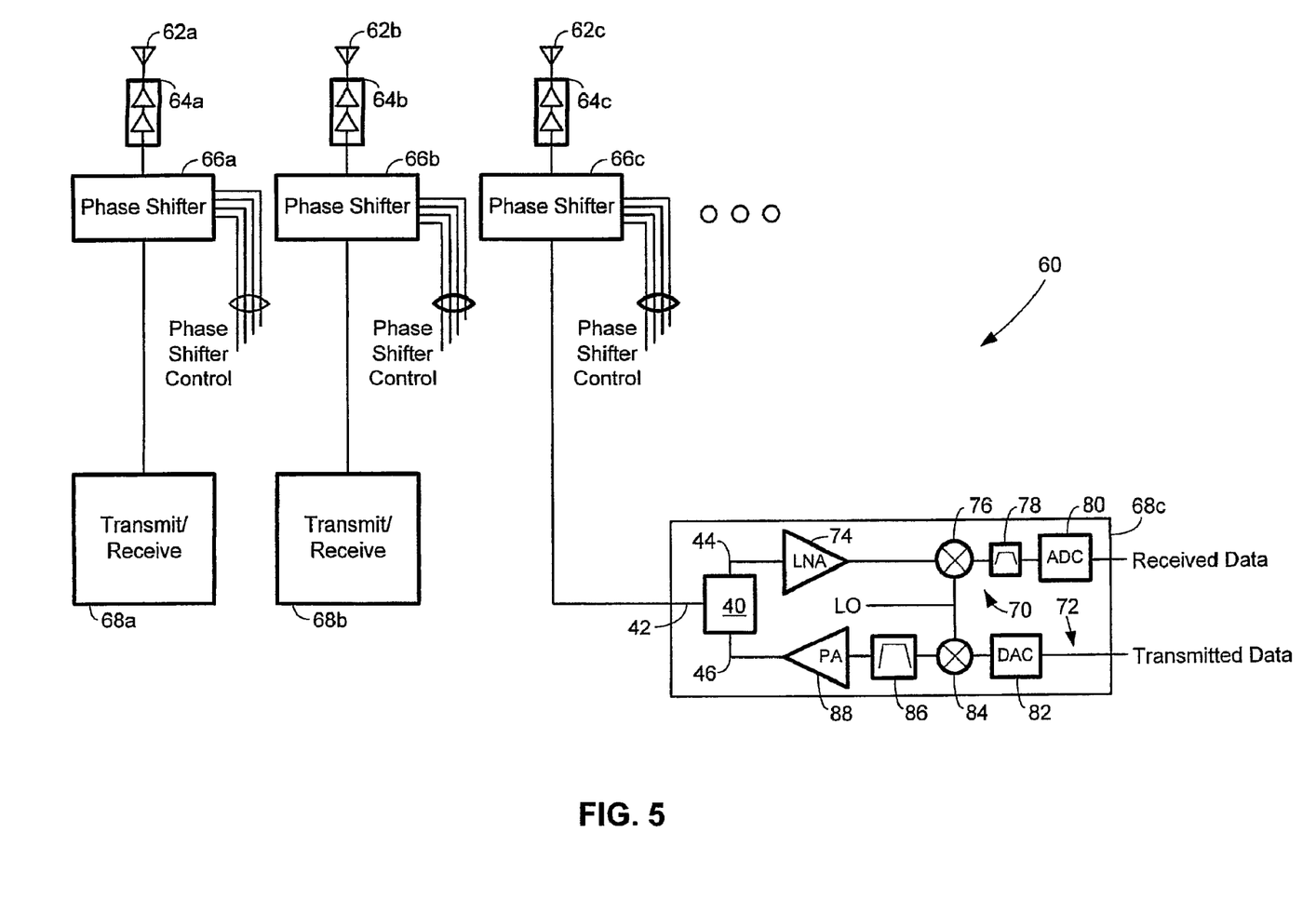
FIG. 5 is a diagram of a phased-array antenna system that incorporates the switch of FIG. 4 according to an embodiment of the invention.

FIG. 5 is a schematic diagram of a phased-array antenna system 60, which incorporates at least one of the PHEMT SPDT switches 40 of FIG. 4 according to an embodiment of the invention. The system 60 includes antenna elements 62a-62n (only elements 62a-62c shown), and corresponding element drivers 64a-64n, phase shifters 66a-66n and transmit/receive modules 68a-68n. The module 68c is shown in detail, it being understood that the remaining modules 68 are the same or similar. More specifically, the module 68c includes a receive channel 70 and a transmit channel 72, and a SPDT switch 40 couples one of the channels 70 and 72 to the phase shifter 66c at any one time.

While the transmit/receive module 68c receives a signal from the antenna element 62c via the driver 64c and the phase shifter 66c, the switch 40 is in the first throw state such that the switch couples the phase shifter to the receive channel 70 via the nodes 42 and 44. A low-noise amplifier 74 amplifies the received signal, and a mixer 76, which receives a local-oscillator (LO) signal, demodulates the received signal. A band-pass filter 78 filters the demodulated signal, and an analog-to-digital converter (ADC) 80 generates the digital received data, which may be further processed by circuitry that is not shown in FIG. 5.

And while the transmit/receive module 68c sends a signal to the antenna element 62c via the driver 64c and the phase shifter 66c, the switch 40 is in the second throw state such that the switch couples the transmit channel 72 to the phase shifter 66c via the nodes 42 and 46. A digital-to-analog converter 82 receives the digital transmit signal from circuitry not shown in FIG. 5, and converts the digital transmit data into an analog transmit signal. A mixer 84, which receives the LO signal, modulates the transmit signal, and a band-pass filter 86 filters the modulated transmit signal. An amplifier 88 amplifies the filtered transmit signal, and the switch 40 couples the amplified transmit signal to the phase shifter 66c, which may impart a phase shift to the amplified transmit signal. The driver 64c amplifies the phase-shifted transmit signal, and provides this signal to the antenna element 62c, which radiates the amplified transmit signal.

Still referring to FIG. 5, alternate embodiments of the phased-array antenna system 60 are contemplated. For example, one or more of the phase shifters 66 may include at least one PHEMT 10 of FIG. 1, or at least one switch 40 of FIG. 4. Furthermore, each of the modules 68 may include additional circuitry, or may omit some of the circuitry that is shown.

Figure 6:
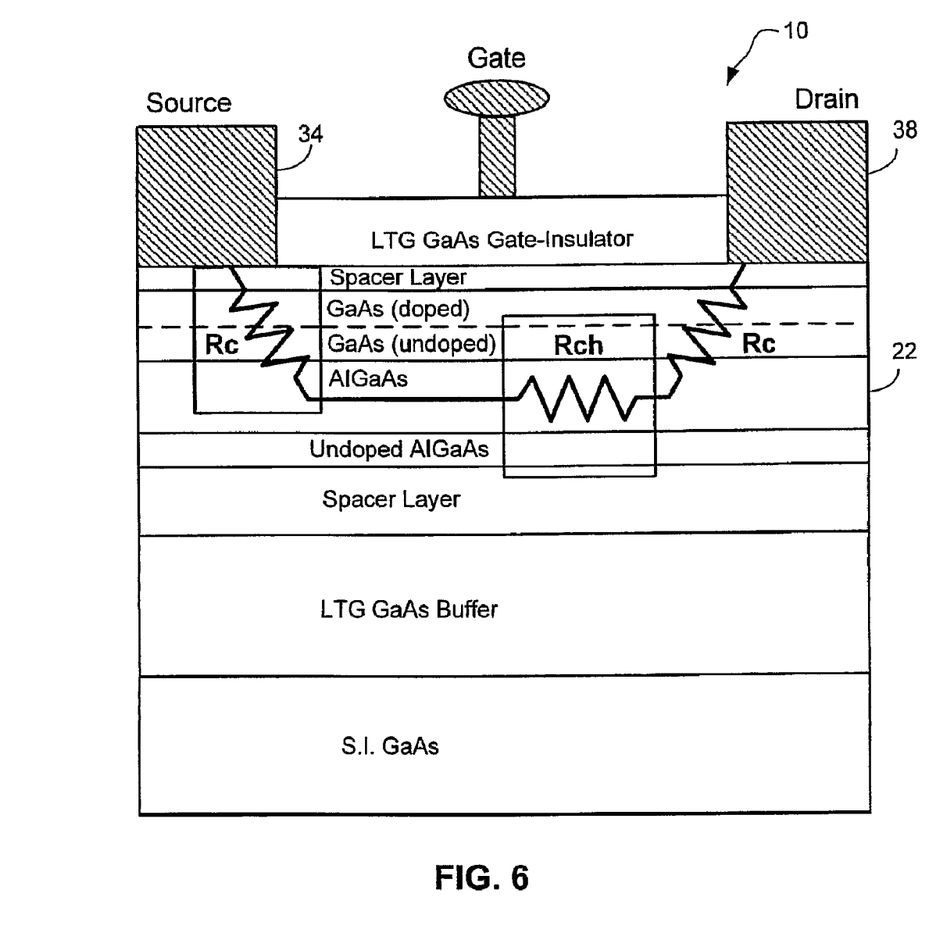
FIG. 6 is a cross-sectional diagram showing the on-state resistance of the PHEMT of FIG. 1 according to an embodiment of the invention.

Referring to FIG. 6, one way to further reduce the on-state resistance of the PHEMT 10 of FIG. 1 is to reduce the contact resistance of the device. The on-state resistance of the PHEMT 10 includes a contact resistance Rc between the source electrode 34 and the channel layer 22, a channel resistance Rch through the channel layer, and a contact resistance Rc between the channel layer and drain electrode 38. Therefore, one may reduce the overall on-state resistance of the PHEMT 10 by reducing the contact resistances Rc respectively associated with the source 34 and the drain 38 electrodes.

According to an embodiment of the invention, one may reduce the contact resistance Rc, and thus may reduce the overall PHEMT on-state resistance, by growing $N^+$ GaAs contacts under the source and drain electrodes 34 and 38, but not under the gate electrode. These contacts contain extra carriers and function as carrier reservoirs, with the channel layer 22 between the contacts. The process of forming these $N^+$ GaAs contacts is referred to as a "re-growth" process because after the layers of the PHEMT (up to and including the $N^+$ GaAs layer) are grown, the PHEMT structure is removed from the growth chamber for etching. After etching the $N^+$ GaAs layer to form the $N^+$ GaAs contacts, the PHEMT structure is placed back into the growth chamber where the gate-insulating layers are "re-grown" over the existing PHEMT structure.

FIGS. 7a-7d show the re-growth process of forming a PHEMT having $N^+$ GaAs contacts according to an embodiment of the invention.

Figure 7:
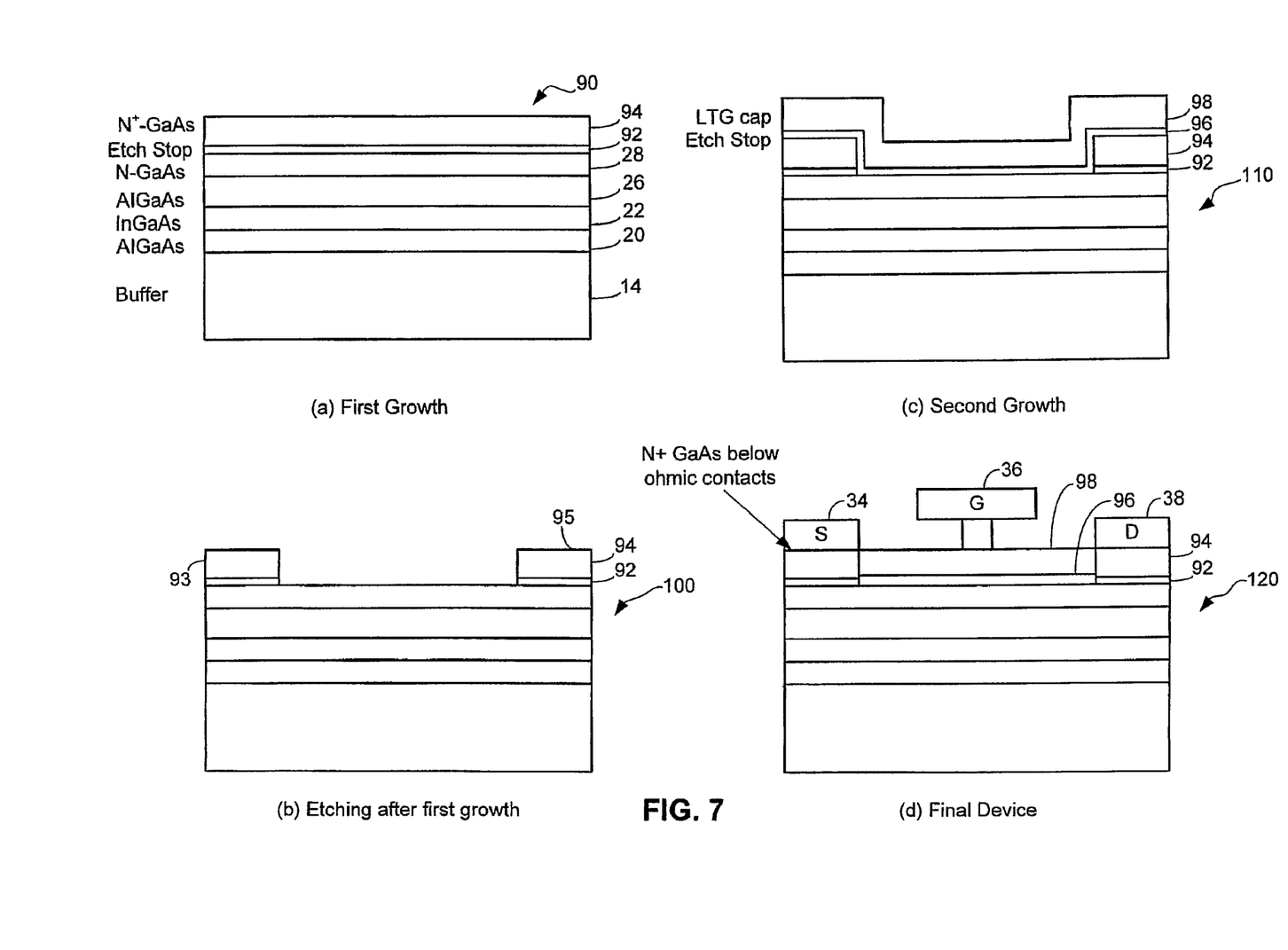
FIGS. 7a-7d show a re-growth process for a PHEMT according to an embodiment of the invention.

Referring to FIG. 7a, a PHEMT structure 90 is formed in an MBE chamber (not shown). The PHEMT structure 90 includes a buffer layer 14, an undoped AlGaAs layer 20, an InGaAs channel layer 22, a doped AlGaAs layer 26, a doped GaAs layer 28, a first etch stop 92, and an $N^+$ GaAs layer 94. The first etch stop 92 may be either AlAs or AlGaAs, and is grown at a conventional growth temperature of approximately 500° C. to 600° C.

Referring to FIG. 7b, the PHEMT structure 90 is removed from the MBE chamber, and portions of the $N^+$ GaAs layer 94 and the first etch stop 92 where the gate-insulating layers will later be formed are etched away. The remaining portions of the $N^+$ GaAs layer 94 and the first etch stop 92 form the $N^+$ GaAs source and drain contacts 93 and 95, resulting in a PHEMT structure 100.

Referring to FIG. 7c, the PHEMT structure 100 is placed back into the MBE chamber (not shown) for re-growth of the gate-insulating layer. Specifically, a second etch stop 96 and a LTG GaAs gate-insulator layer 98 are re-grown over the structure to form a PHEMT structure 110. The second etch stop 96 may be either AlAs or AlGaAs, and is grown at a conventional growth temperature of approximately 500° C. to 600° C. The LTG GaAs gate-insulator layer 98 may be similar to the layer 32 described above in conjunction with FIG. 1, and the manner in which the layer 98 is formed may be similar to the manner in which the layer 32 is formed as described above in conjunction with FIGS. 1-2.

Referring to FIG. 7d, the PHEMT structure 110 is removed from the MBE chamber (not shown) for the etching away of the portions of the LTG GaAs gate-insulator layer 98 and the second etch stop 96 above the $N^+$ GaAs contacts 93 and 95. The source 34 and drain 38 terminals are then formed on the $N^+$ GaAs contacts 93 and 95, respectively, and the gate terminal 36 is formed on the LTG GaAs gate-insulator layer 98 to form a PHEMT device 120, which typically has a reduced on-state resistance as compared to conventional PHEMTs and the PHEMT 10 of FIG. 1. The source, drain, and gate terminals 34, 38, and 36 may be similar to the source, drain, and gate terminals of FIG. 1, and may be formed in a manner similar to the manner in which the source, drain, and gate terminals of FIG. 1 are formed.

Still referring to FIG. 7d, the PHEMT 120 may be used in place of the PHEMT 10 of FIG. 1 in the switch 40 of FIGS. 3-4 and in the antennae system 60 of FIG. 5. Example characteristics of the PHEMT 120 are shown in Table III.

TABLE III

| | LTG GaAs Re-Growth Insulated-Gate PHEMT 120 |
|---|---|
| On-State Resistance | 0.7 Ω-mm |
| Off-State Capacitance | 0.44 pF/mm |
| Operating Voltage | −20 to 2 V |
| Phase Shifter Loss (Ka-Band) | <1.0 dB/BIT |
| Power-Handling Capability | ~5 W |
| Channel Resistance | ~0.4 Ω-mm |
| Contact Resistance | −0.15 Ω |
| Figure-of-Merit RonCoff | ~0.3 ps |
| Quality Factor $Q_s = 1/(wR_{on}C_{off})|_{10\ GHz}$ | 53 |

Furthermore, conventional PHEMTs and LTG GaAs re-growth insulated-gate PHEMTs 120 may be grown on the same wafer according to an embodiment of the invention. This is possible because the LTG GaAs gate-insulator layer 98 may be re-grown on all of the PHEMT structures on the wafer, and then selectively removed from the structures that are desired to be conventional PHEMTs.

FIGS. 8a-8d show a process of forming a conventional PHEMT 120' on the same wafer as the LTG GaAs re-growth insulated-gate PHEMT 120 of FIGS. 7a-7d according to an embodiment of the invention.

Specifically, FIGS. 8a-8d show another region of the same wafer of FIGS. 7a-7d at the same respective times during the PHEMT formation process. That is, FIGS. 7a and 8a respectively show first and second regions of the wafer at a first point in the process, FIGS. 7b and 8b respectively show the first and second regions of the wafer at a second point in the process, and so on. The first region shown in FIGS. 7a-7d is the region of the wafer where the insulated-gate PHEMT 120 is formed, and the second region shown in FIGS. 8a-8d is the region of the wafer where the conventional PHEMT 120' is formed.

Figure 8:
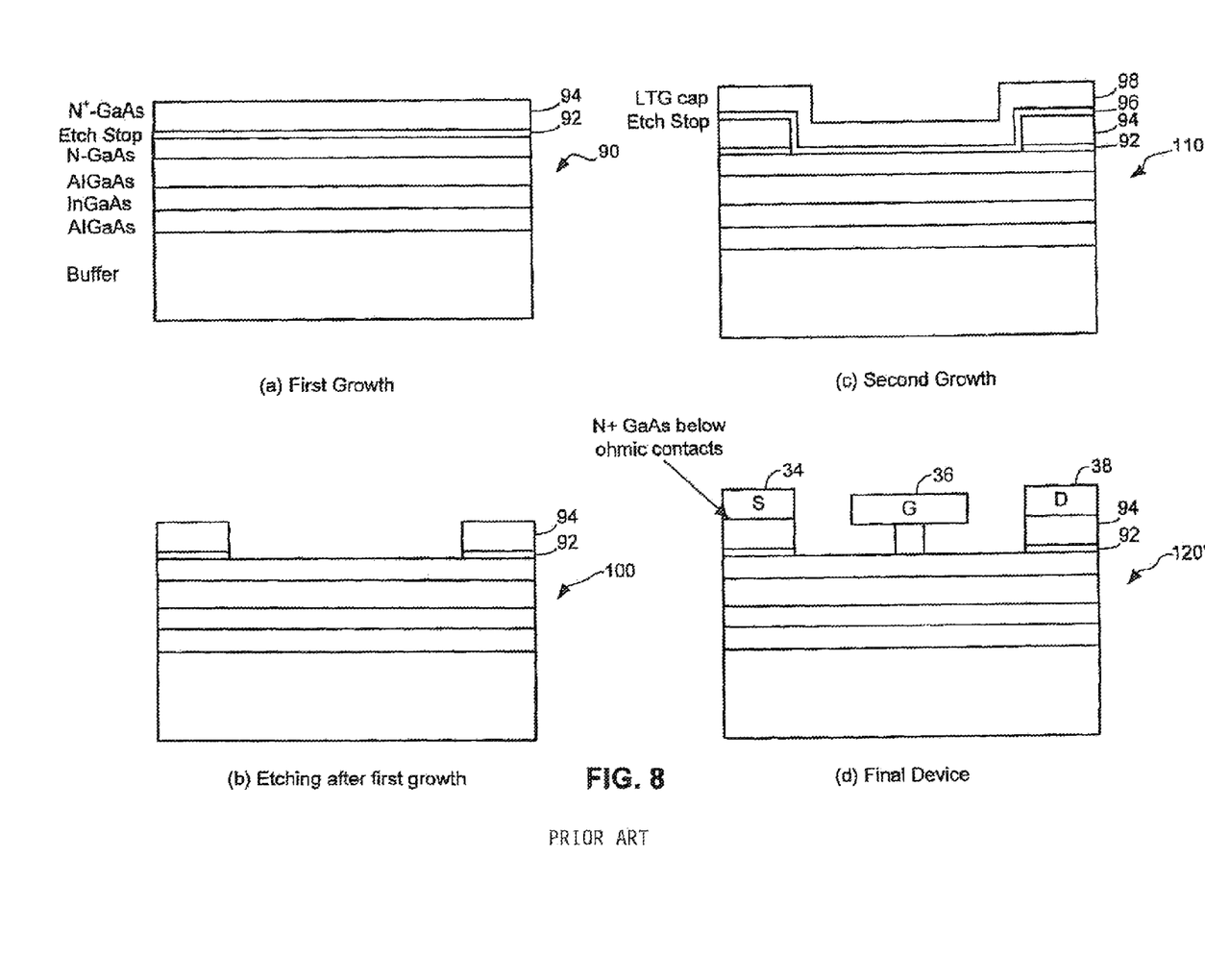
FIGS. 8a-8d show a re-growth process for a conventional PHEMT grown on the same wafer as the PHEMT of FIGS. 7a-7d according to an embodiment of the invention.

FIGS. 8a-8c are similar to FIGS. 7a-7c, indicating that the formation processes for the PHEMT 120 and the PHEMT 120' are similar through the point of the process shown in FIGS. 7c and 8c.

In contrast, FIG. 8d differs from FIG. 7d, and thus indicates that all portions of the LTG GaAs gate-insulator layer 98 and the second etch stop 96 have been etched away from the second region of the wafer before forming the source 34, the drain 38, and the gate 36 terminals to complete the conventional PHEMT 120', which does not include a LTG GaAs gate-insulator layer.

Referring to FIGS. 5, 7a-7d, and 8a-8d, because conventional PHEMTs 120' and LTG GaAs re-growth insulated-gate PHEMTs 120 may be grown on the same wafer, it is possible for systems such as the phased-array antenna system 60, or portions thereof, to be formed on one monolithic integrated circuit. For example, the phase shifters 66 and the transmitter/receivers 68 may all be disposed on a single monolithic integrated circuit.

Furthermore, although the LTG GaAs insulated-gate PHEMTs 10 of FIG. 1 and 120 of FIG. 7d have been described for use in switching applications, these PHEMTs may also be used in logic-type applications (e.g., to compose a logic gate such as a NAND or NOR gate), or in any other application where a low on-resistance is desired.

From the foregoing it will be appreciated that, although specific embodiments of the invention have been described herein for purposes of illustration, various modifications may be made without deviating from the spirit and scope of the invention.

What is claimed is:

1. A pseudormorphic-high-electron-mobility-transistor (PHEMT), comprising:
   a substrate;
   a low-temperature-grown (LTG) GaAs gate-insulator layer disposed on the substrate wherein said LTG GaAs gate-insulator-layer has thickness in the range of approximately 200A and 1000A;
   a gate electrode disposed on the LTG GaAs gate-insulator layer;
   a channel layer disposed between the substrate and the LTG GaAs gate-insulator-layer;
   a first spacer layer disposed between a GaAs layer and the LTG GaAs gate-insulator layer;
   the GaAs layer disposed between the channel layer and the LTG GaAs gate-insulator layer wherein said GaAs layer is doped with silicon and has a thickness in the range of approximately 100A to 500A;
   wherein the first spacer layer comprises an AlAs layer having a thickness in the range of approximately 25A to 100A;
   and further comprising a: LTG GaAs buffer layer disposed between the substrate and the channel layer;
   and wherein the LTG GaAs buffer layer has a thickness in the range of approximately 0.5 um to 1.0 um, and further comprising a second spacer layer disposed between the LTG GaAs buffer layer and the channel layer;
   and wherein the second spacer layer comprises:
   an AlAs layer;
   an AlGaAs layer; and
   a super lattice layer disposed between the AlAs and AlGaAs layers;
   wherein the AlAs layer is doped with silicon and has a thickness of approximately 100A;
   the super lattice layer comprises a GaAs/AlGaAs layer having a thickness in the range of approximately 200A to 800A; the AlGaAs layer is doped with silicon and has a thickness of approximately 50A.

2. The PHEMT of claim 1, wherein the channel layer comprises an InGaAs layer having a thickness in the range of approximately 90 Å to 120 Å.

3. The PHEMT of claim 1, further comprising:
   a channel layer disposed between the substrate and the LTG GaAs gate-insulating layer;
   a gate electrode;
   a source electrode;
   a drain electrode;
   a first $N^+$ GaAs contact disposed between the source electrode and the channel layer and not under the gate electrode; and
   a second $N^+$ GaAs contact disposed between the drain electrode and the channel layers and not under the gate electrode.

* * * * *